United States Patent [19]

Parks

[11] 4,070,692
[45] Jan. 24, 1978

[54] VIDEO DIGITIZING SYSTEM FOR SINGLE VALUED FUNCTIONS

[75] Inventor: John D. Parks, Lorton, Va.

[73] Assignee: The United States of America as represented by the Secretary of the Army, Washington, D.C.

[21] Appl. No.: 575,894

[22] Filed: May 8, 1975

[51] Int. Cl.² ............................................. H04N 7/18
[52] U.S. Cl. ..................................... 358/107; 358/127
[58] Field of Search .................... 178/DIG. 36, 6, 6.8; 235/61.6 A; 358/107, 127, 139

[56] References Cited

U.S. PATENT DOCUMENTS

| 3,598,963 | 8/1971 | Osugi | 235/61.6 A |
| 3,644,714 | 2/1972 | Phillips | 235/61.11 E |
| 3,781,467 | 12/1973 | Soames | 178/6.8 |

Primary Examiner—Robert L. Griffin
Assistant Examiner—Edward L. Coles
Attorney, Agent, or Firm—Nathan Edelberg; Robert P. Gibson; Saul Elbaum

[57] ABSTRACT

A visual plot of a single valued function is rotated orthogonally and then viewed by a TV camera. The camera output is recorded on a video recorder and then played back to a digitizer. The digitizer horizontally scans the rotated plot and detects the time interval for each horizontal scan to intersect a respective point on the rotated plot. The intervals correspond to the amplitude of different points along the plot. The information derived may be stored for subsequent data processing.

6 Claims, 9 Drawing Figures

VIDEO DIGITIZING SYSTEM FOR SINGLE VALUED FUNCTIONS

RIGHTS OF THE GOVERNMENT

The invention described herein may be manufactured, used, and licensed by or for the U.S. Government for governmental purposes without the payment to me of any royalty thereon.

BRIEF DESCRIPTION OF THE PRIOR ART

In the past, in order to perform data processing of single-valued analog signals, manual methods have been employed to determine the amplitude of various points on a plot, which were then reduced to digital form. One example of this is a device known as the Gerber Scale, manufactured by the Gerber Scientific Company, Hartford, Conn. The device comprises a spring having alternately colored turns thereon. By stretching the spring from a baseline to various ordinate points on the plot, distance is measured, corresponding to amplitude. As will be appreciated, the results are somewhat coarse and the method is extremely inconvenient.

BRIEF DESCRIPTION OF THE PRESENT INVENTION

The present invention is directed to an electronic system for digitizing single-valued analog signals in a convenient and accurate procedure.

A video recording (plot) is made of a particular single-valued analog signal and by using pulse techniques, the amplitude at the various points of the plot is quantized. Corresponding digital data are derived after the plot is quantized, and this information may be stored for later data processing. The present invention does not require the utilization of mechanical devices such as the aforementioned Gerber Scale. It is a convenient and accurate method for digitizing or quantizing a single-valued function.

The above-mentioned objects and advantages of the present invention will be more clearly understood when considered in conjunction with the accompanying drawings, in which:

BRIEF DESCRIPTION OF THE FIGURES

FIGS. 4–9 illustrate timing diagrams that relate to the sequence of operation of the present system.

DETAILED DESCRIPTION OF THE INVENTION

Figure 1:
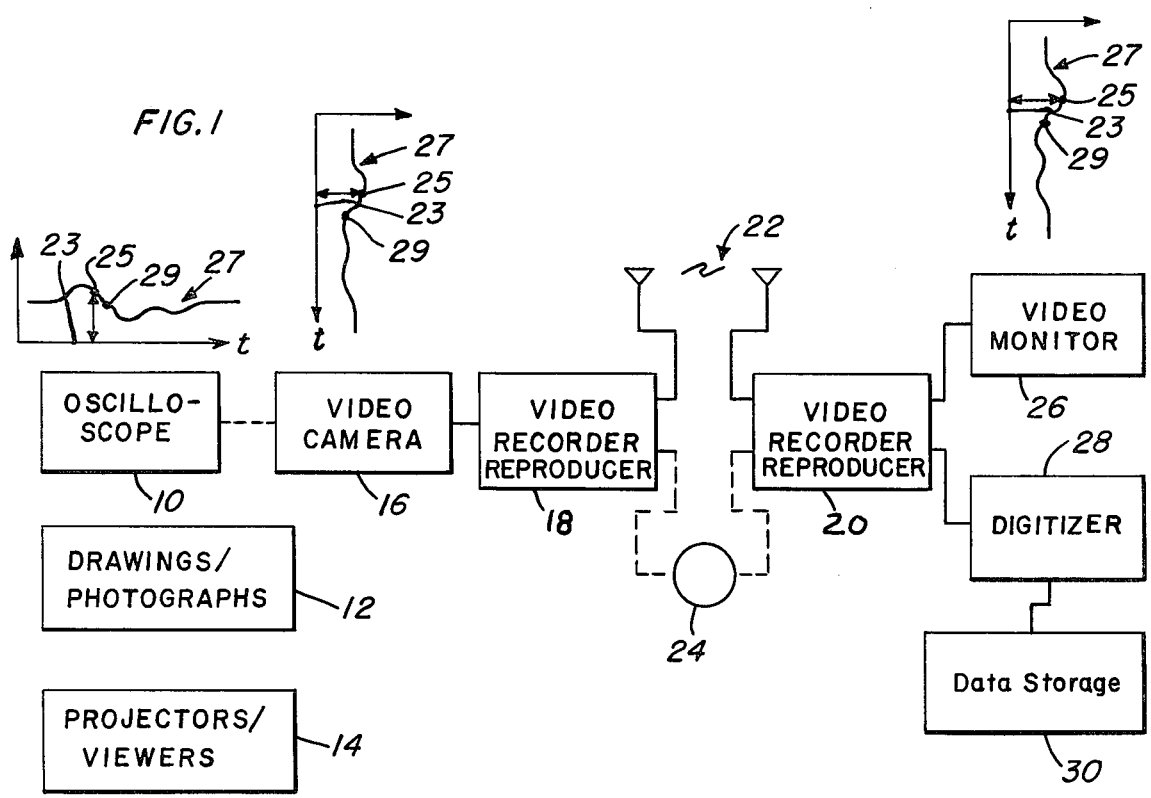
FIG. 1 is a block diagram of the present system.
Figure 2:
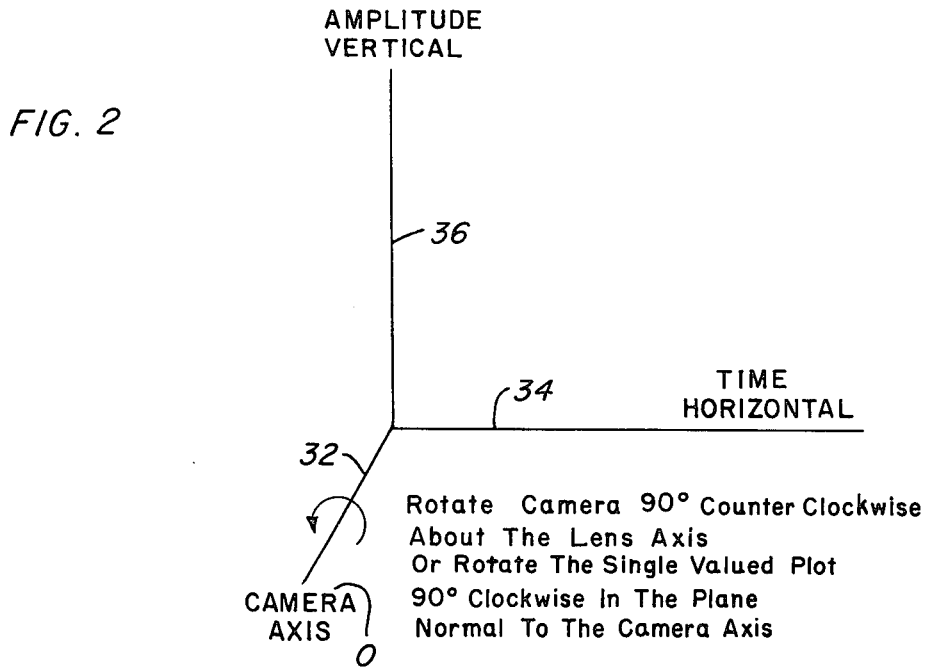
FIG. 2 illustrates the three-dimensional coordinate system about which a plot is rotated, relative to a viewing TV camera.

Referring to the figures and more particularly FIG. 1 thereof, a basic block diagram of the present video digitizer system is shown. Originally, a single-valued function is displayed on an oscilloscope 10, or alternately may be presented in visual form, on drawings/photographs 12 or projectors/viewers 14. The conventional visual presentation from any of the sources 10, 12 or 14 demonstrates amplitude as a function of time, generally indicated along the abscissa or horizontal axis. A video camera 16 (FIG. 1) is rotated 90° (FIG. 2) about the lens axis 32, counterclockwise, so that the previous abscissa of the video camera now becomes the ordinate axis and vice versa. Thus, the time or horizontal axis 34, shown in FIG. 2 is displaced to the amplitude or vertical axis 36.

In FIG. 1, the rotated video camera 16 takes several frames of a still image as presented by a source 10, 12 or 14. In the event the oscilloscope 10 is used, and a transient is observed, (single sweep) the video camera 16 will customarily record a maximum of three frames before the transient image disappears from the oscilloscope CRT. The video recorder/reproducer 18 records the image on video tape and may reproduce the image on a video monitor 26 or relay it to a second video recorder/reproducer 20 by an R-F line 22 or by video tape 24, in which case the video recorder/reproducer 18 is in fact the video recorder/reproducer 20.

During the digitization of the single-valued function, a video monitor 26 is set up so that the function may be displayed, full scale, on the monitor. Once the video tape on the recorder/reproducer is adjusted so that a full scale display appears on the video monitor, the digitizer 28 may be activated to cause the quantization of the function and storage occurs at 30. A conventional video recorder/reproducer has a rotating head which may repetitively scan a single frame of video tape. This makes it possible to present, on video monitor 26, a stationary reproduction of a transient image for an undetermined period of time. The video camera and recorder/reproducer are conventional units, such as those manufactured by SONY Corporation. The video monitor 26 is a conventional CRT monitor. As an illustration of the present system, a plot 27, which is a single-valued function, is illustrated adjacent to the oscilloscope 10 and the video monitor 26 which displays the function 27.

Figure 3:
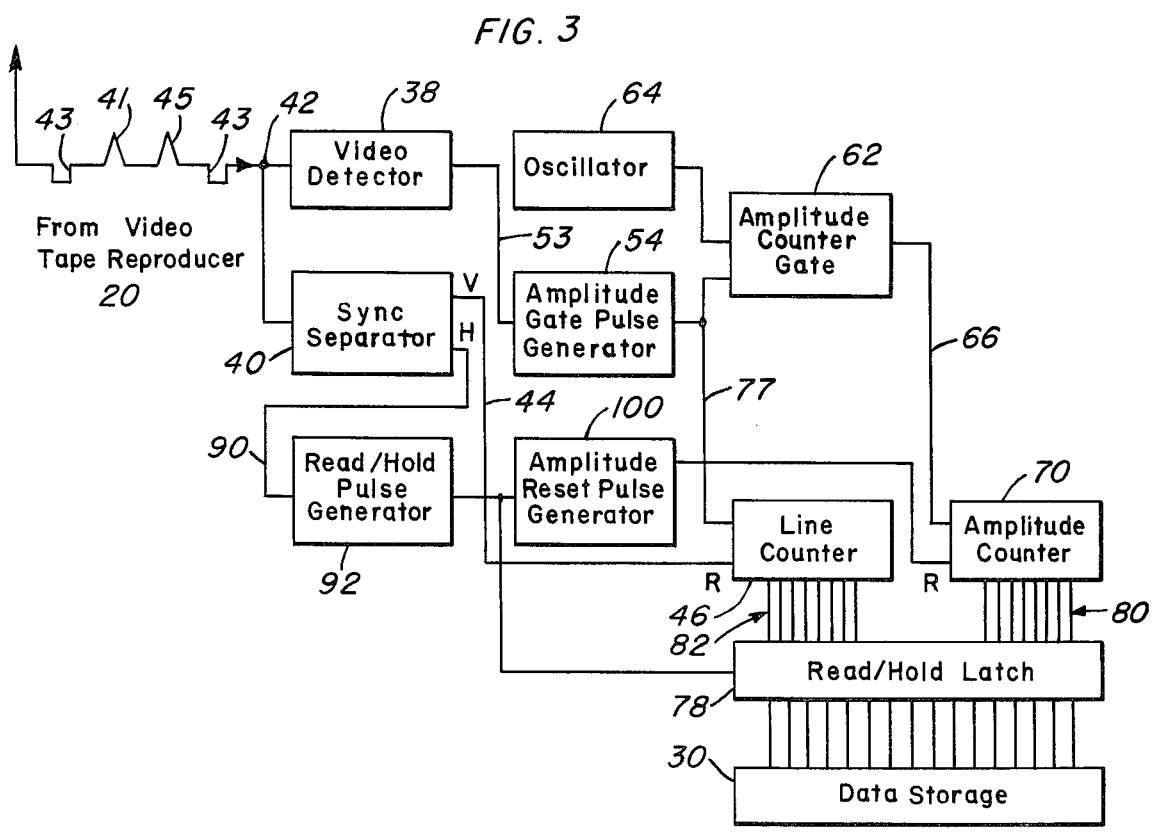
FIG. 3 is a block diagram of the digitizer, shown in FIG. 1.

Reference is now made to FIG. 3 for a description of the digitizer 28. The output from the video recorder/reproducer 20 is fed to the input 42 of sync separator 40 and video detector 38. This detector is a threshold-pulse detector of conventional design. The purpose of the detector is to sense the presence of the spike pulses 41 and 45 between the horizontal sync pulses 43.

Pulse 41 corresponds to a point on the baseline 23 (FIG. 1) while pulse 45 corresponds to a point on the plot 27. The interval between pulse 41 and 45 is determinative of the amplitude of a point 25 on plot 27 relative to baseline 23. With the video camera rotated 90° counter-clockwise, the video horizontal scan lines scan vertically upward and are rastered from left to right with reference to the object 10, 12 or 14 viewed by video camera 16. The amplitude of equally horizontally spaced points on plot 27 is determined by the interval between pulses 41 and 45 on each video horizontal scan line as these scan lines are rastered across the object from left to right with the rotated camera.

Sync separator 40 is a conventional video sync separator of the type used in television receivers. The standard relationship between vertical and horizontal sync pulses of 525 horizontal lines per frame is used. The output lead 44 from the sync separator 40 transmits the vertical pulses to a line counter 46, at a RESET input thereof. The counter 46 may be two interconnected Motorola IC chips MC 5493L. The purpose of this line counter will be explained hereinafter. The signal present on line 44 is generally indicated by reference numeral 48 in FIG. 4. As will be seen, periodic pulses 50 and 52 will be generated to indicate the sequential generation of vertical sync pulses.

The output 39 (shown in FIG. 7) from video detector 38 is fed to an amplitude gate pulse generator 54 which is essentially a flip-flop circuit of conventional design, such as Motorola IC chip MC 5493L. Pulses 41 and 45 of output signal 39 correspond with the similarly numbered pulses in FIG. 3. The output signal from generator 54 is indicated as 56 in FIG. 8. It is fed to the gate input of an amplitude counter gate 62 for gating the pulses from a conventional oscillator 64. The gate 62 may be a Motorola IC 4337L. The gated oscillations are transmitted along lead 66 to an amplitude counter 70 such as the type made up of two Motorola IC chips MC 5493L. Referring to FIG. 8, the plot 56 of the output from generator 54 includes pulses of varying widths, the widths corresponding to the amplitude at various points along plot 27 (FIG. 1). Pulse 58 corresponds to point 25 (FIG. 1) while pulse 60 corresponds to point 29 in FIG. 1.

Referring to FIG. 9, a plot is shown by reference numeral 72 which includes a series of pulses 74, the pulses being gated by signal 56 (FIG. 8). During the interval when pulse 58 (FIG. 8) appears, the various oscillations in 74 (FIG. 9) become effective. The individual pulses in 74 are generated by oscillator 64 (FIG. 3).

Due to the high operating frequencies of the system, the various pulses 74 shown in FIG. 9 will actually be sinusoidal in nature so that counter 70 essentially counts the cycles of pulses 74 for the period of pulse 58.

As will be noted in FIG. 9, the number of cycles in 74 are greater than the number of cycles in 76. This indicates that the amplitude of the original plot is decreasing, which of course is the case between points 25 and 29 of FIG. 1. The counter 70 is a binary divide-by-eight counter.

A read/hold latch 78 is provided to store the cycle count from amplitude counter 70, feeding its count along output lines 80. The line counter 46 is provided with a raster scan count, along the input lead 77. The line counter 46 communicates with the latch 78 via leads 82. For each horizontal video scan, the information from latch 78 is read out and during subsequent cycle, the latch 78 is reloaded. The operational cycle of latch 78 is twofold. Initially, it reads the count from the line counter 46 and the amplitude counter 70. Then, the latch 78 is closed to permit the information from the latch to be read out. The read/hold pulse generator 92 controls the mode of operation for latch 78. The latch 78 may be made up from four Motorola IC chips MC 4337L.

The sync separator 40 has a horizontal pulse output 90 which is connected to the read/hold pulse generator 92, such as Motorola IC MC 54121L. Each time a video horizontal pulse occurs, the generator 92 generates a signal to drive the amplitude reset pulse generator 100, which is a conventional pulse delay circuit, such as Motorola IC MC 54121L. The output from generator 100 is indicated by plot 102 in FIG. 6. As will be noted, the pulses 104 and 106 of the plot 102 correspond with respective pulses 96 and 98 of plot 94, but a slight constant delay exists between the corresponding pulses.

I wish it to be understood that I do not desire to be limited to the exact details of construction shown and described, for obvious modifications can be made by a person skilled in the art.

Wherefore, the following is claimed:

1. A video digitizing system comprising:
   a visual source representing a plot of a single-valued function;
   a stationary TV camera positioned near the visual source and scanning the source in a manner producing a single intersection between each horizontal scan of the camera and the plot;
   means connected to the camera for recording horizontal scan information and reproducing electrical signals representing images of the plot;
   means connected to the reproducing means for digitizing the signal for subsequent data storage, the means for digitizing comprising a video detector for generating adjacent pulses with intervals between adjacent pulses corresponding to relative amplitude changes along the plot;
   a pulse generating means connected to the output of the detector for generating gate pulses having varying widths corresponding to the intervals between adjacent pulses from the video detector;
   an amplitude counter gate having at least two inputs, the first input accepting relatively high frequency count cycles from an oscillator while the second input accepts the gate pulses which gate the count cycles on and off during corresponding horizontal scans from the video reproducing means;
   an amplitude counter means connected at its input to the output of the amplitude counter gate for counting the gated cycles during corresponding horizontal scans, each count relating to the amplitude of a respective point along the plot;
   a line counter means connected at its first input to the output of the pulse generating means for determining the vertical scan count;
   a sync separator which transmits vertical pulses to the reset input of the line counter;
   a latch register connected to the output of the amplitude and line counter means for storing the count thereof during a particular horizontal scan; and
   a means connected to the latch register output for storing the various counts, indicative of the amplitude of respective points along the plot.

2. The subject matter of claim 1 together with means connected to the latch register output for storing the various counts, indicative of the amplitude of respective points along the plot.

3. The subject matter of claim 2 together with a read/hold pulse generator which is connected to the horizontal pulse output of the sync separator for controlling the mode of the latch register.

4. The subject matter of claim 3 together with an amplitude reset pulse generator which receives a signal from the read/hold pulse generator and is connected to an reset input of the amplitude counter.

5. The subject matter of claim 1 wherein the visual source is an oscilloscope display.

6. The subject matter of claim 1 wherein the visual source is a medium showing a permanent record of the plot.

* * * * *